United States Patent [19]

Encellaz et al.

[11] Patent Number: 4,843,323
[45] Date of Patent: Jun. 27, 1989

[54] DEVICE AND METHOD FOR ADJUSTING A RADIOFREQUENCY ANTENNA OF A NUCLEAR MAGNETIC RESONANCE APPARATUS

[75] Inventors: Robert Encellaz, Beynes; Yong C. H. Ng Tong, Pantin, both of France

[73] Assignee: Thomson-CGR, Paris, France

[21] Appl. No.: 180,688

[22] Filed: Apr. 8, 1988

Related U.S. Application Data

[63] Continuation of Ser. No. 935,391, Nov. 26, 1986, abandoned.

[30] Foreign Application Priority Data

Nov. 29, 1985 [FR] France ............................. 85 17722

[51] Int. Cl.$^4$ .............................................. G01N 24/02
[52] U.S. Cl. .................................... 324/313; 324/322
[58] Field of Search ............... 324/313, 314, 318, 322; 328/155; 307/511, 529; 333/17 M

[56] References Cited

U.S. PATENT DOCUMENTS

| | | | |
|---|---|---|---|
| 2,456,800 | 12/1948 | Taylor et al. | 333/17 M |
| 3,443,231 | 5/1969 | Roza | 333/17 M |
| 3,919,644 | 11/1975 | Smolka | 333/17 M |
| 4,095,168 | 6/1978 | Hlavka | |
| 4,110,685 | 8/1978 | Leenerts | 324/58 B |
| 4,411,270 | 10/1983 | Damadian | 128/653 |
| 4,476,578 | 10/1984 | Gaudin et al. | 333/17 M |
| 4,602,213 | 7/1986 | Sugiura | 324/307 |

FOREIGN PATENT DOCUMENTS

| | | |
|---|---|---|
| 0047065 | 3/1982 | European Pat. Off. |
| 0073614 | 3/1983 | European Pat. Off. |
| 0132338 | 5/1985 | European Pat. Off. |
| 0142760 | 5/1985 | European Pat. Off. |
| 0145915 | 5/1985 | European Pat. Off. |
| 8400214 | 1/1984 | World Int. Prop. O. |

OTHER PUBLICATIONS

Journal of Physics E-Scientific Instruments, vol. 14, No. 6, Jun. 1981, pp. 700-701, The Institute of Physics, London, GB; M. Peric et al.: "Simple RF Matching for NMR Coils in Endor Spectrometers".

Cross, V. R. et al., "Single Coil Probe with Transmission-Line Tuning for Nuclear Magnetic Double Resonance".

*Primary Examiner*—Michael J. Tokar
*Assistant Examiner*—Lawrence G. Fess
*Attorney, Agent, or Firm*—Oblon, Fisher, Spivak, McClelland & Maier

[57] ABSTRACT

A device and method are provided for adjusting a radiofrequency antenna of a nuclear magnetic resonance apparatus. In the invention, using capacities preset in the factory, the antenna detuning of an NMR apparatus is limited to a range such that the standing wave rate of a high frequency line which conveys the radiofrequency signal is limited. This line is cut and, at a short distance, a tuning adjustment circuit is inserted. This circuit may be automated: the electric adjustment motors, thus spaced away, do not disturb the magnetic fields of the apparatus. By measuring the real part of the admittance at the input of the adjustment circuit and the phase shift between voltage and current this circuit can be adjusted.

5 Claims, 3 Drawing Sheets

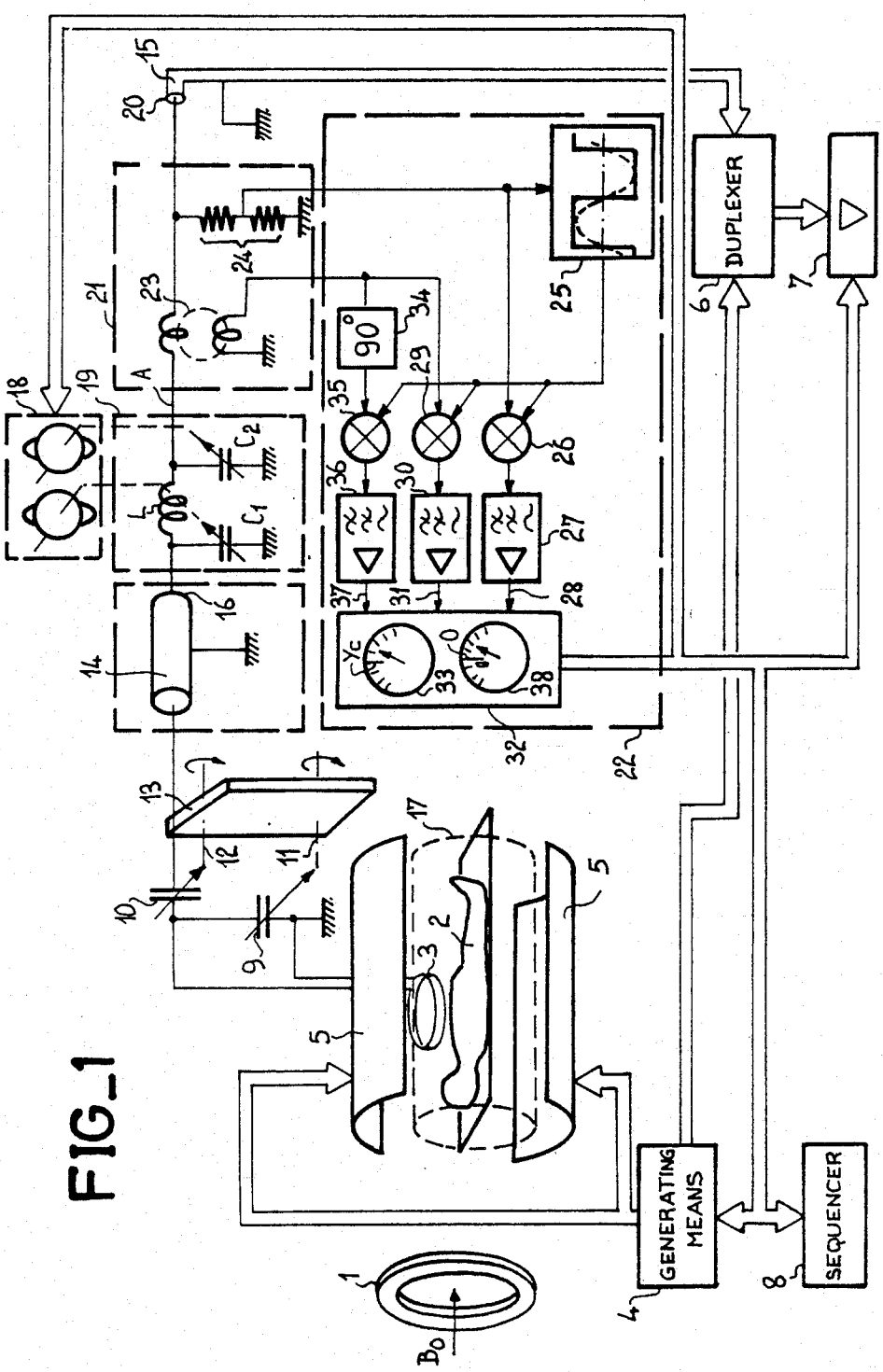
FIG_1

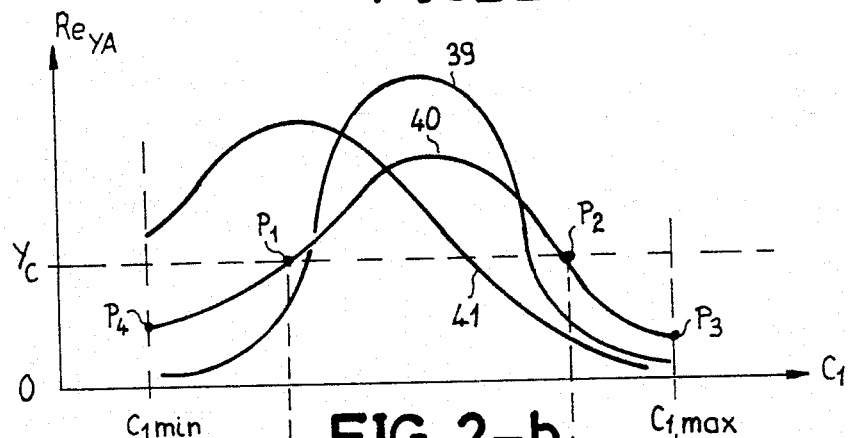
FIG_2-a
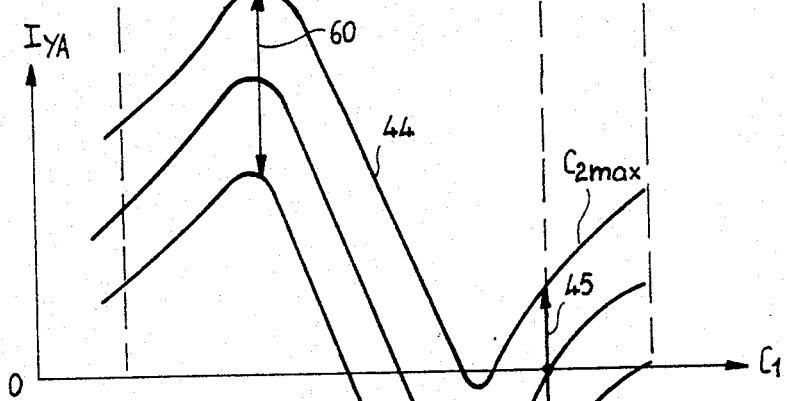
FIG_2-b
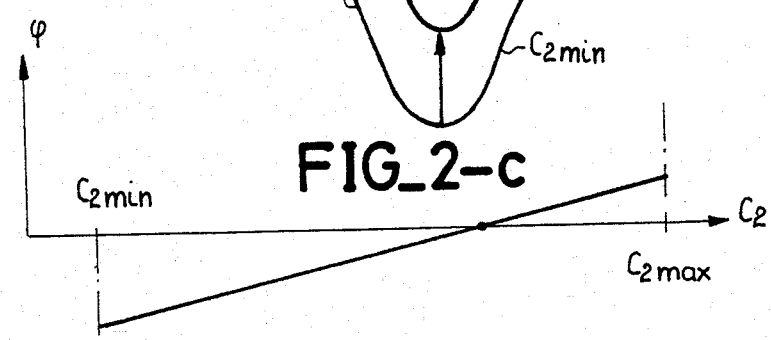
FIG_2-c

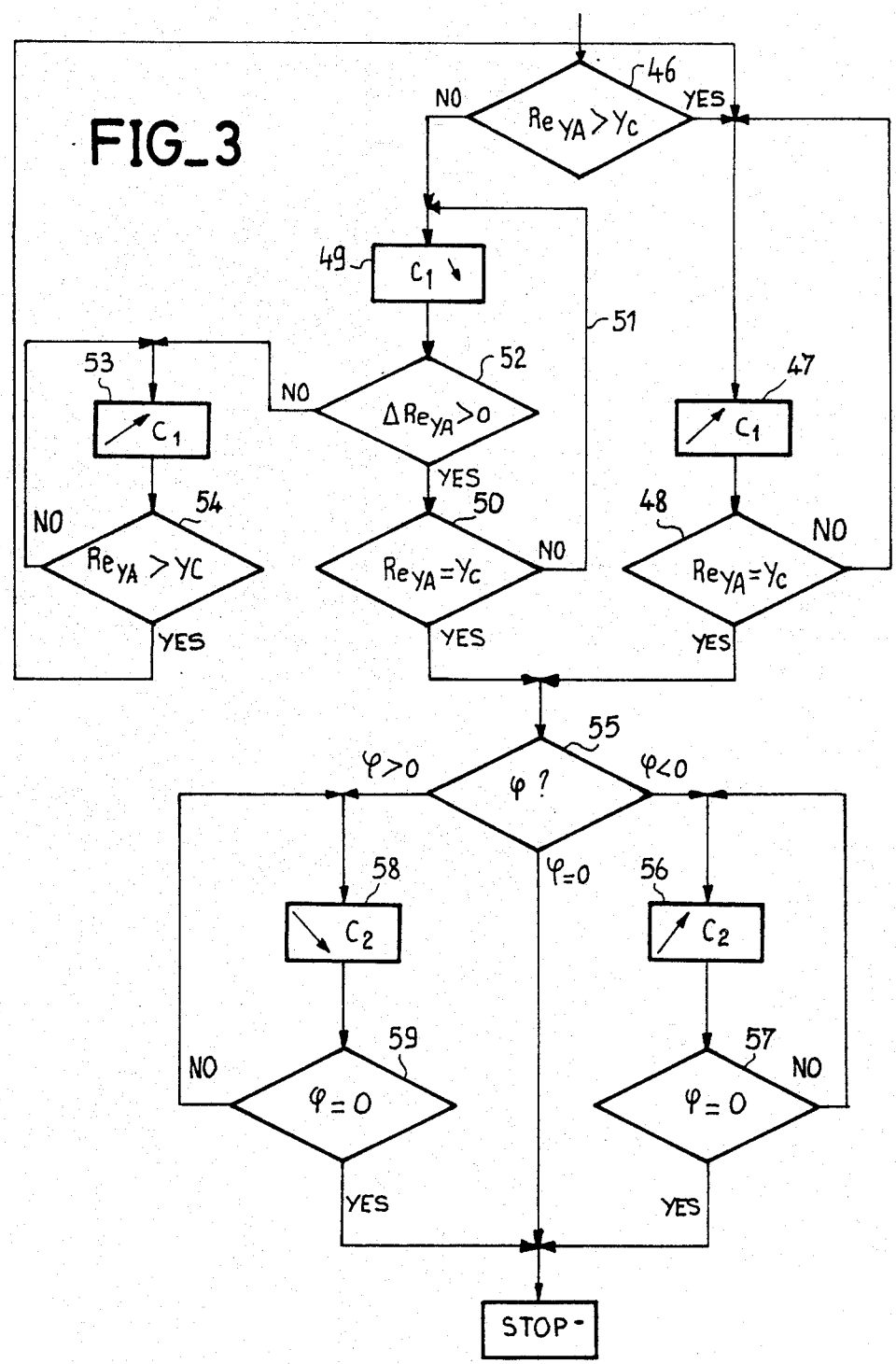
FIG_3

DEVICE AND METHOD FOR ADJUSTING A RADIOFREQUENCY ANTENNA OF A NUCLEAR MAGNETIC RESONANCE APPARATUS

This application is a continuation of application Ser. No. 935,391, filed on Nov. 26, 1986, now abandoned.

FIELD OF THE INVENTION

The present invention relates to a device and method for adjusting a radiofrequency antenna of a nuclear magnetic resonance apparatus. It finds its application more particularly in the medical field where nuclear magnetic resonance (NMR) examinations provide a precious aid in diagnosis. It may nevertheless find its application in other fields. The aim of the present invention is to contribute to the creation of images using NMR apparatus which are most exact and more accurate.

BACKGROUND OF THE INVENTION

An NMR apparatus traditionally includes means for subjecting a body to a constant and intense magnetic field. Thus conditioned, some regions of the body may be energized by radiofrequency excitation and, when this excitation ceases, induce a resonance signal which is measured and which includes information useful for creating images of parts of the body. The excitation and measuring means include a radiofrequency antenna; this antenna is disposed about the body to be examined. The load seen by this antenna at the time of emission, or which comes to the same thing, the internal impedance of the generator which it forms at the time of the measurement, depends essentially on the body subjected to the examination. From one body to another it changes. To provide the best excitation and the best measurement, it is necessary to tune the antenna. Furthermore, the NMR antenna must be matched to the high frequency line which connects it, through a duplexer, either to the emitter or to the receiver. An adjustable device must then be associated with the antenna for matching its impedance. In practice, since high frequency lines are coaxial cables characterized by their characteristic impedance, for example of 50 ohms, the antenna must further be adjusted so that it presents such a real impedance at the operating frequency.

DESCRIPTION OF THE PRIOR ART

A circuit generally used for matching the antennae uses two adjustable capacitors. A first capacitor is connected in parallel with the antenna, it is followed by another connected in series. These two capacitors are conventionally installed in the direct proximity of the antenna itself. They are located as it were in the tunnel of the machine. They are accessible only with difficulty and adjustment thereof is ordinarily carried out manually by means of two linkage rods. In fact, in the present state of the technique, it is impossible to place electric control motors in the tunnel of the machine. They would disturb the magnetic fields too much. Under these conditions, the adjustment must still remain manual which is troublesome. The solution which might consist in extending the rods so that the control motors are at a distance from the tunnel of the machine does not seem feasible because of the complexity of the linkage which this choice would involve.

SUMMARY OF THE INVENTION

The object of the present invention is to overcome the above-mentioned drawbacks in that matching of the antenna is always provided, and that it is provided automatically. In the invention, the tuning capacities known for limiting the impedance mismatching of the antenna to the line are preset in the factory. Then the high frequency line (in practice a coaxial cable) is cut into two parts: a first relatively short part disposed close to the antenna and a longer part which continues it and which is connected to the emission-reception means. Between these two parts an antenna tuning circuit is installed. The purpose of the pre-adjustment is to limit the standing wave rate (SWR) in the small part of the line, for example less than or equal to 3.5.

At the end of the small part of the line it is then possible to dispose a tuning circuit whose settings may be made automatically (with electric motors because, from this point of view, the spacing apart is sufficient).

The invention provides an adjustment device for a nuclear magnetic resonance apparatus comprising an antenna, for emitting and/or receiving from a body under examination in the apparatus radiofrequency resonance signals, connected by a high frequency line to emission/reception means, which device comprises, inserted between the antenna and the emission.reception means, a portion of the high frequency line followed in cascade by an antenna tuning circuit.

The invention further provides a method of adjusting a nuclear magnetic resonance apparatus having an antenna for emitting and receiving a radiofrequency resonance signal, connected by a high frequency line to emission/reception means, wherein:

between the antenna and the emission/reception means is inserted a portion of the high frequency line, connected in cascade to an antenna tuning circuit and to a sensor, this sensor being itself connected to a circuit for measuring the detuning, and the apparatus is adjusted by adjusting the tuning circuit as a function of the results delivered by the circuit measuring the detuning.

BRIEF SUMMARY OF THE DRAWINGS

The invention will be better understood from reading the following description with reference to the accompanying figures. They are given solely by way of indication and are in no wise limitative of the invention. In the figures, the same references designate the same elements.

They show:

FIG. 1: an NMR apparatus equipped with the device of the invention;

FIGS. 2a, 2b and 2c: diagrams of adjusting components of the tuning circuit as a function of the load presented by the body examined;

FIG. 3: a flow chart showing a preferred variant of the adjustment procedure.

DESCRIPTION OF THE PREFERRED EMBODIMENT OF THE INVENTION

FIG. 1 shows an NMR apparatus equipped with the adjustment device of the invention. This NMR apparatus includes means 1 for subjecting a body examined 2 to an intense and constant magnetic field $B_O$. Subjected to this influence, body 2 further receives through an antenna 3 a radiofrequency excitation emitted by generating means 4. The apparatus further includes so-called gradient coils 5 for particularizing certain regions of body 2 of which an image is desired. The resonance signal emitted by body 2 is picked up by the antenna 3 and is directed, in particular by means of a duplexer 6, towards reception and processing means 7. The generating means 4 and the reception means 7 are drive by a sequencer 8. In the direct proximity of the antenna are placed conventional capacities 9 and 10 provided for tuning the antenna. In the state of the technique, the adjustment of these capacities is effected by means of rods respectively 11 and 12 projecting from the rear face 13 of the apparatus.

In the invention, the connection which connected antenna 3 (with its intrinsic tuning circuit 9,10) to the duplexer 6 is cut. This high frequency connection often comprises a coaxial cable whose braid is connected to ground. A first relatively short section 14 is thus followed by a second section 15. The length of the first section 14 is sufficiently great so that, at its end 16 the furthest away from the access tunnel 17 of the machine, an automatic device 18 may be disposed for motorizing an inserted antenna tuning circuit 19. Since section 14 is not matched, additional losses result due to the mismatching, in addition to the losses in the dielectric and in the conductor. These losses are limited by limiting the length of the section to the minimum required and by limiting the SWR in this section. Limitation of the SWR is obtained by presetting the capacities 9 and 10. In practice, if the impedance of the antenna is correctly set, the SWR in this section does not exceed 3 in cases as different as the presentation of an adult or a child for examination. The reception and processing means 7 are matched to the characteristic impedance of the high frequency line section 15. In one example where the field $B_0$ is equal to about 0.5 tesla, the resonance frequency of the NMR signal is equal to 21.3 MHz. With a coaxial cable of the RX 4/RG 213 U type, a section 14 of 3 m in length, and if the load presented by the body 2 to the antenna 3 is matched from the input to the output of section 14, the resonance signal is attenuated by 0.10 dB. On the other hand, if this load is mismatched, so that the standing wave rate in section 14 remains substantially less than 3.5, the attenuation is equal to 0.16 dB. In other words, the additional loss of 0.06 dB is negligible with regard to the advantage obtained by section 14: that of allowing the presence of drive means 18.

Preferably, the tuning circuit 19 is formed of two adjustable capacitors $C_1$ and $C_2$ and an inductance L mounted in the form of $\pi$. Capacitor $C_1$ is the capacitor the closest to section 14. For the convenience of the explanations which follow the downstream output of the tuning circuit 19 is called A. The values of the capacities $C_1$ and $C_2$, as well as their adjustment range and the value of the self inductance L are calculated as a function of the load impedance range which it is desired to match. For example, the self impedance L has a value of 0.2 microHenry and capacities $C_1$ and $C_2$ are capacities adjustable between 220 pF and 720 pF. Circuit 19 could however have another form. For example, it could include more than three reactive elements. Or else, it could include a T assembly of two adjustable inductances connected in series, on each side of a fixed parallel capacity. The $\pi$ mounting presented is preferred because it is the simplest and because adjustable capacities are industrially more accessible than adjustable inductances.

The procedure for adjusting capacities $C_1$ and $C_2$ will now be described. For that, the reasoning will be based on the admittances at point A. In a first stage, it can be seen that capacity $C_2$ only adds a purely imaginary admittance to the admittance seen from point A. Consequently a variation of $C_2$ only modifies the imaginary part of this admittance whereas the real part of this admittance only depends on the value of $C_1$. This judicious remark leads to choosing a particularly simple adjustment procedure. For matching the antenna, the real part and the imaginary part of the admittance seen from point A must then be measured. The adjustment procedure consists then in adjusting $C_1$ so that the real part of the admittance is equal to the characteristic admittance of section 15, and in adjusting $C_2$ so as to cancel out the imaginary part of this admittance. The procedure is preferably carried out in this order since tuning of the antenna may thus be obtained with two single adjustments.

To achieve this adjustment, a sensor 21 connected to a circuit 22 measuring the detuning is disposed between the tuning circuit 19 and the input 20 of section 15. The sensor picks up a signal coming from the generator (on emission) and allows the voltage-current characteristics to be known of the signal which passes through the connection 14–15 at the input A of circuit 19. These characteristics are the same as at reception. Sensor 21 includes a current transformer 23 for taking a signal proportional to the current. It further includes a divider bridge 24 for taking off a signal proportional to the voltage. Circuit 22 for measuring the detuning includes a chopping amplifier 25 for producing a so-called square signal synchronous with the resonance signal. The signal proportional to the voltage is introduced therein, amplified, then chopped so as to produce an AC signal with zero DC component, including successive equal pulses of opposite signs.

The signal proportional to the voltage of the antenna signal is fed into a first mixer 26 where it is multiplied by the square signal. This multiplication provides full wave rectification. After low frequency filtering and standardizing amplification in a first shaper circuit 27, the signal leaving mixer 26 is transformed into a signal 28 representative of the modulus of the voltage of the antenna signal ($|V|$). The signal proportional to the current of the antenna signal taken off through the coupling 23, undergoes a similar processing in a second mixer 29 followed by a second shaper circuit 30. Taking into account the phase shift $\phi$ between the current and the voltage of the antenna signal, and considering the fact that the mixers are driven at their second input by the same square signal, the shaper circuit 30 delivers a signal 31 proportional to the product of the modulus of the current of the antenna signal multiplied by the cosine of the phase shift angle between the current and the voltage of the antenna signal ($|I| \cos \phi$). The measuring means 22 further include computing means 32 for working out the ratio of signal 31 to signal 28. The ratio may be obtained for example using a microprocessor specially adapted for this function or by using logarithmic dividers. The ratio is equal to the real part $\text{Re} y_A$ of the admittance at point A. The computing means 32 include a display means 33 for indicating this real part of the admittance. The means 33 include an indication $Y_c$ corresponding to the characteristic admittance of section 15.

Furthermore, the signal proportional to the current is subjected to a 90° phase shift and standardization chopping in circuit 34. Then the signal delivered by circuit 34 is subjected to processing similar to the preceding processing by introducing it into a third mixer 35 followed by a third shaper circuit 36. The signal 37 delivered by circuit 36 is also introduced into the computing means 32. These further comprise a second display device 38 representative of the phase shift $\phi$ between the current and the voltage of the antenna signal. In fact, the signal 37 thus transformed is equal to the sine of this phase shift. The principle of adjustment of $C_1$ and $C_2$ is then simple: $C_1$ is adjusted so that the first indicator 33 points to $Y_c$, then $C_2$ is adjusted so that the second indicator 38 points to 0. When this latter points to 0, $\phi$ is zero, the current and the voltage are in phase: the imaginary part $I_{YA}$ of the admittance at point A is zero.

FIGS. 2a to 2c show the trends respectively of the real part $Re_{YA}$ of the admittance at point A, for three different types of body 2, when capacity $C_1$ varies. FIG. 2b shows the variation of the imaginary part $I_{YA}$ of the admittance at point A for one type of body and with different values of $C_2$ (three cases) when $C_1$ varies. FIG. 2c shows the evolution of the phase shift $\phi$ at point A when $C_2$ varies. In the diagram of FIG. 2a, the characteristic admittance $Y_c$ is shown. Depending on the body examined, curves 39, 40, 41, it can be seen that the real part of the admittance passes through a maximum situated between two minima. The variation of capacity $C_1$ has been limited to the values which this capacity may take in a practical example of use. In the preferred example, the values $C_{1min}$ and $C_{1max}$ corresponds respectively to 220 pF and 720 pF. It can be seen that there may be two possibilities in some cases for adjusting $C_1$. In fact, the maximum of curves 39 to 41 is greater than $Y_c$, and their minima are less than it.

Curves 39 and 40 correspond to the cases where there are two values of $C_1$ ($P_1$ and $P_2$) for which the real part $Re_{YA}$ of the admittance at point A is equal to $Y_c$. For the curve 41, the range of variation of $C_1$ towards the low values is insufficient for a second time reaching an equality between the real part of the admittance at point A and the characteristic admittance of section 15. By examining curves 42 to 44 of FIG. 2b, it can be seen that for $P_1$ the imaginary part $I_{YA}$ of the admittance at point A is positive whereas for $P_2$ it is negative. For $P_1$ a self inductance would be required in place of $C_2$ so as to be able to cancel out the imaginary part. Whereas for $P_2$, the imaginary part can be cancelled out with the capacity $C_2$. Thus, in most cases, only the point of adjustment $P_2$ may satisfy the two conditions $Re_{YA} = Y_c$ and $I_{YA} = 0$.

Optimization of the capacities $C_1$ and $C_2$ is obtained when they have the smallest adjustment range so that all the loads corresponding to limited SWRs, for example between 1 and 3.5, may be concerned. The optimization relates to the cost of the adjustable capacities. The smaller their range, the less expensive they are. The three curves 42 to 44 shown in FIG. 2b are parametered by values of $C_2$. These curves 42 to 44 are included between the curves corresponding to $C_{2min}$ and $C_{2max}$. Once the adjustment of $C_1$ has been made, the value of the imaginary part of the admittance at point A belongs to a segment 45 of values depending, for a given value of $C_1$, on different values of $C_2$. $I_{YA}$ may then be cancelled out by adjusting $C_2$. When $C_2$ varies, FIG. 2c shows us that the phase shift $\phi$ passes through a zero value and that the admittance becomes real.

FIG. 3 shows a flow chart of automatic processing to be used by the central unit-sequencer 8 which receives the information from the indicators 33 and 38. Depending on these measurements, the central unit 8 gives instructions to the drive means 18 for adjusting the capacities $C_1$ and $C_2$. The functioning of this flow chart should be studied with reference also to FIGS. 2a to 2c. In a first stage, in a test 46, the central unit compares the value of the real part of the admittance with the characteristic admittance. If this real part is greater than it (FIG. 2a), an instruction 47 for increasing the capacity $C_1$ is sent to the drive means 18. In a test 48, the behavior of this real part of the admittance is studied with respect to the characteristic admittance. As soon as the value of the characteristic admittance is reached, the adjustment of $C_1$ is finished. On the other hand, if the real part $Re_{YA}$ is less than $Y_c$: by an instruction 49 the value of the capacity $C_1$ is decreased. In a comparator 52, the evolution of $Re_{YA}$ is then measured. If this evolution is positive ($\Delta Re_{YA} > 0$) and as long as the value $Y_c$ has not been reached (test 50), the adjustment is continued by a loop 51. As soon as this value is reached the adjustment is stopped. This adjustment may be reached if at the outset $Re_{YA}$ was between $P_3$ (FIG. 2a) and $P_2$. On the other hand, if $Re_{YA}$ was between $P_1$ and $P_4$, the decrease of $C_1$ causes the variation of $Re_{YA}$ to be negative. The comparator 52 detects this eventuality. In this case, $C_1$ is increased by an instruction 53 until a test 54 indicates that $Re_{YA}$ becomes greater than $Y_c$: the adjustment point $P_1$ has then just been exceeded. In this case, it is preferably decided to join the adjustment point $P_2$. In fact, for the value of $C_1$ thus found the segment 60 of the values of $I_{YA}$ as a function of $C_2$ does not necessarily include a zero value. Thus, instead of stopping the adjustment of $C_1$, test 54 branches to a sequence including the instruction 47.

With the adjustment of $C_1$ thus obtained, by a test 55, the value of the phase shift with respect to 0 is measured. If this phase shift is less than 0, $C_2$ should be increased by sending an instruction 56 to the drive means 18. This instruction persists as long as a test 57 does not show cancelling out of the phase shift. If this phase shift, at the outset, is greater than 0, an instruction 58 and a test 59 play the dual role of the instruction 56 and the test 57. As soon as the phase shift is cancelled out, the adjustment is terminated. On the other hand, if the phase shift is zero, at the outset, the value $C_2$ is not modified.

What is claimed is:

1. A device for adjusting a nuclear magnetic resonance apparatus having an antenna comprising:
    a first length of high frequency line connected to said apparatus's emissive/receptive means;
    an antenna tuning circuit connected to said first length of high frequency line for tuning said antenna;
    a sensor interposed between said apparatus's emissive/receptive means and said tuning circuit for measuring the amount of tuning;
    measuring means coupled to said sensor for measuring the real part of admittance by multiplying the antenna signal by a square signal synchronous with the antenna signal and for measuring the phase shift between the current and voltage of the antenna signal; and
    a second length of high frequency line coupled to said tuning circuit on one end and said antenna at the other end.

2. The device as claimed in claim 1 wherein the means for measuring the phase shift includes means for phase shifting a signal that is proportional to the current and for multiplying this phase shifted signal by a square wave signal synchronous with the antenna signal.

3. The device as claimed in claim 1 wherein the high frequency line is a coaxial cable whose characteristic impedance is equal to 50 ohms.

4. The device as claimed in claim 1 wherein the tuning circuit is a $\pi$ circuit with two adjustable capacities in parallel at the terminals of a fixed inductance.

5. The device as claimed in claim 1 wherein the sensor includes a coupling circuit for picking up a signal proportional to the current and a divider bridge for picking up a signal proportional to the voltage of the antenna signal.

* * * * *